United States Patent [19]

Kuban et al.

[11] Patent Number: 5,428,622
[45] Date of Patent: Jun. 27, 1995

[54] TESTING ARCHITECTURE WITH INDEPENDENT SCAN PATHS

[75] Inventors: John R. Kuban, Heath; Robert D. Maher, III, Carrollton, both of Tex.

[73] Assignee: Cyrix Corporation, Richardson, Tex.

[21] Appl. No.: 27,036

[22] Filed: Mar. 5, 1993

[51] Int. Cl.⁶ ............... G01R 31/317; G06F 11/22
[52] U.S. Cl. ..................... 371/22.3; 371/22.1; 371/22.4; 324/73.1
[58] Field of Search ............ 371/22.3, 22.4, 25.1, 371/22.1, 71; 364/489, 488; 324/73.1

[56] References Cited

U.S. PATENT DOCUMENTS 5,001,713  3/1991  Whetsel ..................... 371/22.3
5,054,024  10/1991  Whetsel ..................... 371/22.3
5,210,759  5/1993  Dewitt et al. ............... 371/22.3 R

*Primary Examiner*—Emanuel T. Voeltz
*Assistant Examiner*—Kaminis Shah
*Attorney, Agent, or Firm*—Andrew S. Viger; John L. Maxin

[57] ABSTRACT

A scan test architecture includes first and second serial scan paths for transferring test data to and from an integrated circuit's logic. A first clock controls transfer of information on the first scan path and a second clock controls transfer of data on the second scan path. The first and second clocks are alternately enabled by a control signal initiated under program control of the external test system.

9 Claims, 3 Drawing Sheets

TESTING ARCHITECTURE WITH INDEPENDENT SCAN PATHS

TECHNICAL FIELD OF THE INVENTION

This invention relates in general to the testing of integrated circuits and more particularly to scan testing of integrated circuits using independent scan paths.

BACKGROUND OF THE INVENTION

An important step in the manufacture of integrated circuits is testing individual circuits to ensure that they are operational (i.e., that they produce correct outputs) and meet functional criteria such as temperature and speed requirements. In order properly test a circuit to find manufacturing errors, it is desirable to isolate sections of logic within the integrated circuit for testing.

A popular method of providing individual testing is referred to as "scan testing" in which a serial stream of data is propagated through the chip in a serial stream through a plurality of serially connected shift registers. After the registers are loaded, the data is output from some of these registers through the logic of the integrated circuit and the output of the logic is stored in other shift registers in the scan path. This data is then shifted out for observation.

One drawback of scan testing, particularly in latch-based designs, is that the shift registers are inefficiently used because data received from the stimulated logic overwrites data stored in the receiving shift registers. Hence, these receiving registers cannot be used to store test data to stimulate logic. Consequently, the scan path is unnecessarily long, which reduces the speed at which the testing apparatus may perform tests on the integrated circuit's logic.

Therefore, a need has arisen to provide a high-speed test architecture for testing the logic of an integrated circuit.

SUMMARY OF THE INVENTION

The invention is a test architecture integrated on an integrated circuit for testing the logic of the integrated circuit. The test circuitry provides a first and second serial scan paths, each scan path including a plurality of shift registers. The data transfer through each scan path is controlled by a separate scan clock. The first and second scan clocks are alternately enabled responsive to a control signal.

The present invention provides significant advantages over the prior art. First, the shift registers associated with one path may receive test data which stimulates logic on the integrated circuit to produce outputs received by shift registers on the other scan path. Thus, the length of each scan path may be substantially decreased relative to a single scan path system. Second, the scan paths can be flexibly configured to allow minimum test time for certain portions of the integrated circuit which require the greatest amount of testing.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

The detailed description of an exemplary embodiment of the scan testing architecture of the present invention is organized as follows:

1. Overall Test System
2. Scan Test Architecture
   2.1 General Architecture
   2.2 Control Signals
   2.3 Alternative Embodiments
3. Conclusion This organizational table, and the corresponding headings used in this detailed description, are provided for convenience of reference only.

The exemplary test circuitry is used in testing the logic of a microprocessor, such as a microprocessor compatible with the Intel x86 family. The test circuit, however, could be used in any integrated circuit where testing of individual logic sections is desired, particularly in connection with a latch-based design. Detailed description of conventional or known aspects of microprocessor systems or scan test systems are omitted so as to not obscure the description of the invention with unnecessary detail.

1. Overall Test System

Figure 1:
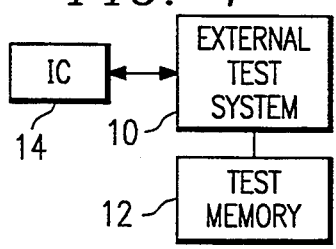
FIG. 1 illustrates a block diagram of an exemplary test system for testing an integrated circuit.

FIG. 1 illustrates a block diagram of a test system for testing an integrated circuit. The test system 10 includes test memory 12 and is connected to the integrated circuit (IC) 14 under test. The test system 10 is programmed to provide the test data to the test circuitry of the IC 14 and read the results of the test from the IC 14. Test data for stimulating the IC's logic is stored in the test memory 12.

A number of IC test systems exist for conventional scan test architectures. The use of these test systems with the test system shown in the preferred embodiment of the invention, as set forth below, requires some modification of the test systems protocol, as would be known to one skilled in the art.

Figure 2:
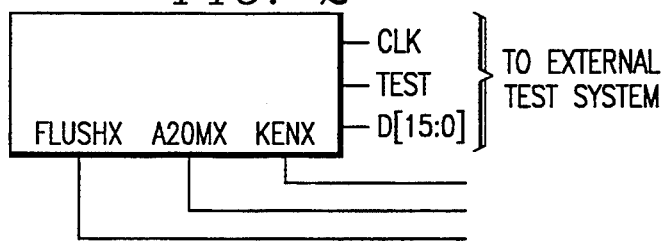
FIG. 2 illustrates exemplary pin-outs used by the test system in a microprocessor in incorporating the test architecture of the present invention.

In operation, the test system 10 controls the operation of the IC 14 through its external pins. While a number of pins would be used in an actual test operation, FIG. 2 illustrates specific pins used to control scan testing in the implementation described herein. Data from the test system 10 is transferred between the test system 10 and IC 14 through the data pins D[15:0] of the IC (the number of data I/O pins will depend on the particular microprocessor design). The clock (CLK) signal is also controlled by the test system 10. Three pins, FLUSHX, A20MX and KENX are used to control the operation of the internal test architecture of the IC 14 as will described in greater detail hereinbelow. During normal operation of the microprocessor, these pins are used for certain microprocessor operations unrelated to scan testing, but when the TEST pin is asserted, these pins are used to control the test as described below. It should be understood that pins other than those shown in FIG. 2 could be used to perform the control functions.

Figure 3A:
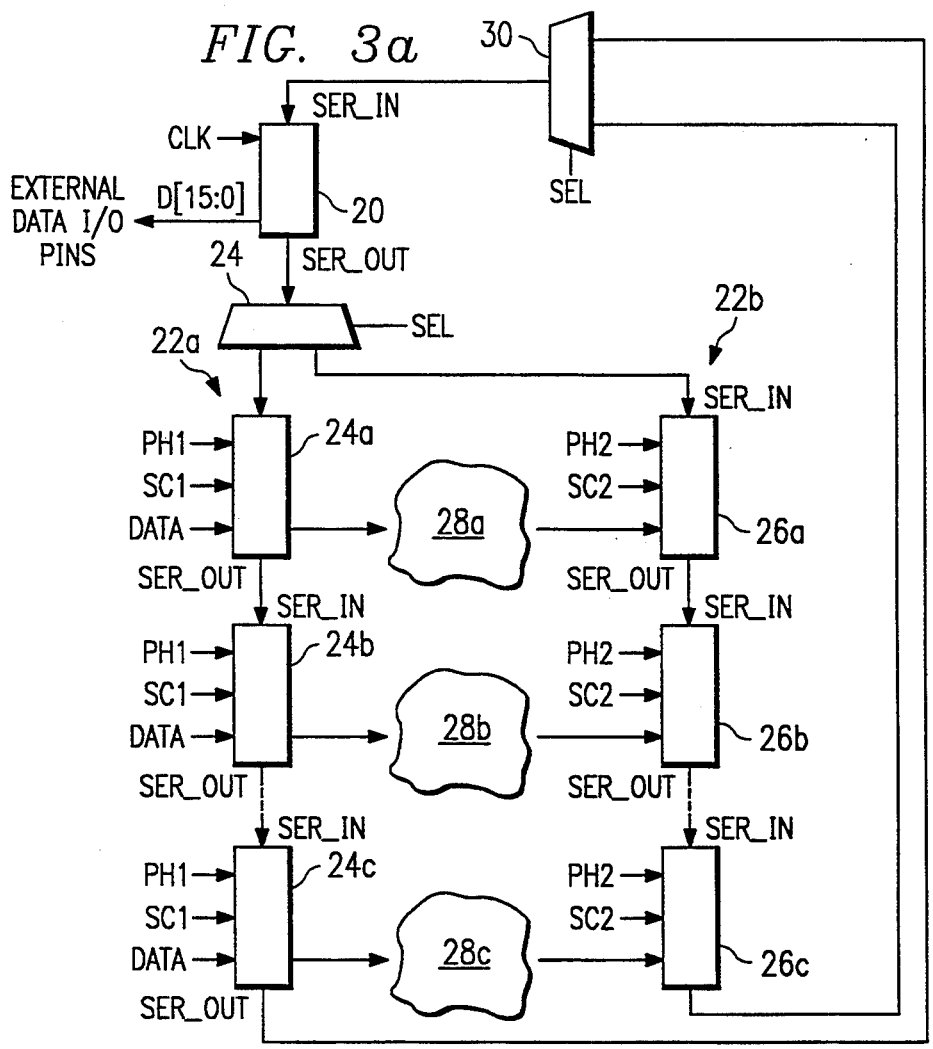
FIGS. 3a-b illustrate a first embodiment of the scan path architecture.
Figure 3B:
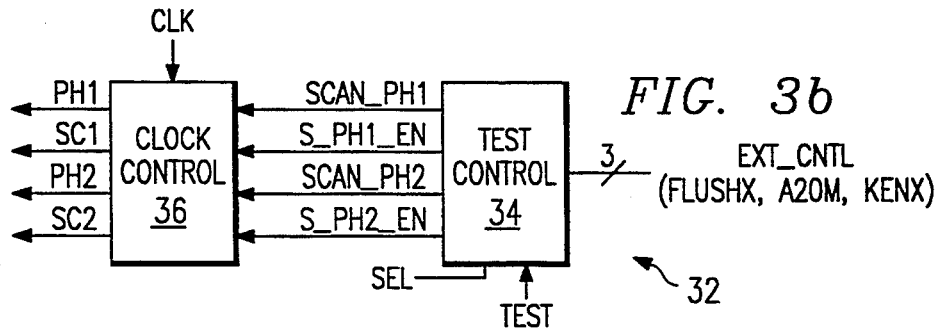
Figure 4:
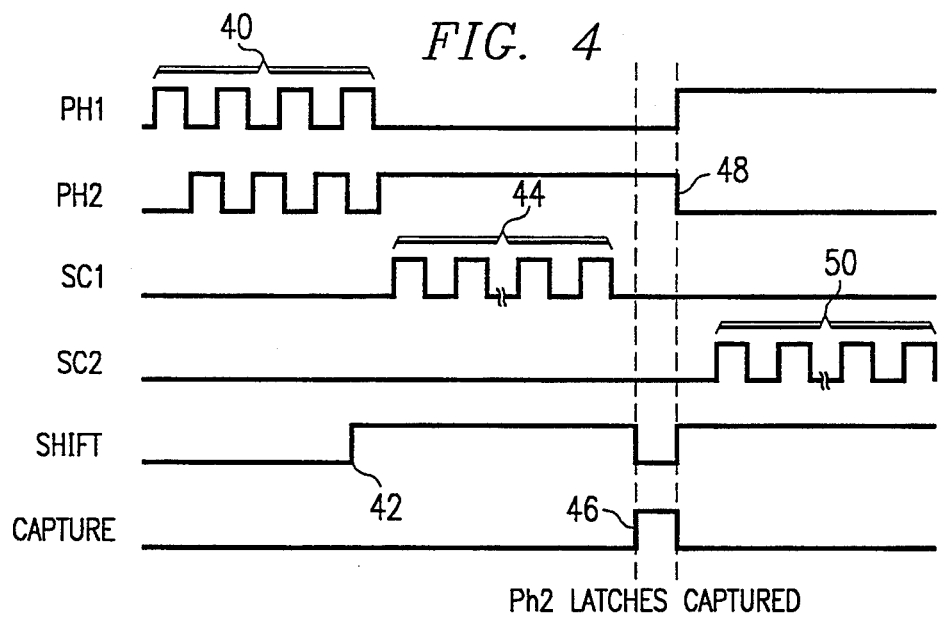
FIG. 4 illustrates a timing diagram showing clocks associated with operation of the scan test circuitry.

2. Scan Test Architecture 2.1 General Architecture. The general architecture of the preferred embodiment of the present invention is best discussed in connection with FIGS. 3a–b and 4. FIGS. 3a–b illustrate a block diagram of a first embodiment of the present invention.

Test data is transferred to and from the IC 14 through data I/O shift register 20. Data I/O register 20 transfers data to and from the data I/O pins D[15:0] in parallel. The serial output (SEROUT) of shift register 20 can be directed to one of two scan paths 22a or 22b through multiplexer 24 under direction of the SEL signal. Scan path 22a comprises a plurality of shift registers 24 (referenced individually as shift registers 24a–c) and scan path 22b comprises a plurality of shift registers 26 (referenced individually as shift registers 26a–c). The shift registers in each scan path 22a and 22b are serially connected; i.e., the serial output of one shift register is coupled to the serial input of the next shift register in the scan path. When PH1 is low, data may be scanned into the shift registers 24 through the serial ports responsive to SC1. On a high-to-low transition of PH1, the shift registers 24 latch data on their parallel inputs (DATA). Similarly, each shift register 26 in scan path 22b receives two clock signals, PH2 and SC2. When PH2 is low, data may be scanned into the shift registers 26 through the serial ports responsive to SC2. On a high-to-low transition of PH2, the shift registers 26 latch data on their parallel inputs. In the illustrated embodiment, the parallel inputs of shift s registers 26 are connected to the output of various logic sections of the IC 14, namely logic circuits 28a–c.

In an exemplary operation of the test circuitry, test data is stored in the scan path 22a by receiving the test data from the external test system 10 through I/O pins D[15:0]. This data is stored in shift register 20 and is then serially shifted into scan path 22a (in this example). After the test data is fully stored in the first scan path 22a, the shift registers 26 of the second scan path, scan path 22b in this example, latch the data output from the respective logic circuits 28a–c. This data is then serially output to the shift register 20 via the second scan path 22b through multiplexer 30. The shift register 20 outputs the data to the external test system 10 for evaluation.

FIG. 3b illustrates a block diagram of the control circuitry 32 which controls operation of the scan paths 22a–b shown in FIG. 3a. Test control circuitry 34 receives the TEST signal, along with the signals on the three external control pins, FLUSHX, A20MX and KENX. If TEST is enabled, then the test control circuitry 34 enters a test state, set forth in Table 1 below, depending upon the values of the external control signals. The test control circuitry outputs four clock control signals, SCANPH1, SPH1EN, SCANPH2 and SPH2EN, to clock control circuitry 36. Test control circuitry also outputs the SEL signal to chose which scan path is coupled to shift register 20.

Clock control circuitry 36 generates the clocks PH1, SC1, PH2, and SC2 (based on the CLK signal) and outputs the clocks to the shift registers 24 and 26 of the scan paths 22a and 22b, respectively. SCANPH1 stops the PH1 and PH2 clocks with PH1 low and PH2 high. Similarly, SCANPH2 stops the PH1 and PH2 clocks with PH2 low and PH1 high. SPH1EN enables the SC1 clocks to run and SPH2EN enables the SC2 clocks to run. When both PH1 and PH2 are running, they are inverses of one another (see FIG. 4).

2.2 Control Signals. The operation of the test control circuitry is best understood by referring to Table 1 and FIG. 4, which is a timing diagram showing the interaction of the external control signals, the clock signals to the scan paths 22a–b, and the internal control signals of the test control circuit 34.

TABLE 1

| Scan Control States | | | |
|---|---|---|---|
| FLUSHX | A20MX | KENX | STATE |
| 0 | 0 | 0 | IDLE (PH1, PH2 run) |
| 0 | 0 | 1 | SCAN (selected scan clock active) |
| 0 | 1 | 0 | LOAD test data from D[15:0] to selected scan path |
| 1 | 0 | 0 | WRITE scan data from D[15:0] to external pins |
| 1 | 0 | 1 | CAPTURE (flip clocks) |

Initially (upon reset of the IC 14), the test control circuitry 34 is set to point to the scan path 22a as the active scan path—hence, SEL will be set to allow serial communication between the shift register 20 and scan path 22a. Until the test control circuitry 34 enters another state, the PH1 and PH2 clocks run normally, as shown in state 40 of FIG. 4. At this point, no data is being transferred into the scan paths.

To begin a test cycle, the external test circuitry 10 sets the external pins to "010" to enter the load state. This state loads the external data on the D[15:0] pins into shift register 20, Once loaded, the external test circuitry test sets the external control pins to "001" to enter the scan state. In the scan state, data from shift register 20 is serially scanned into the active scan path, initially set to scan path 22a. Upon entering the scan state, the SHIFT signal (internal to the test control circuitry 34) transitions high (at state 42), thereby setting the appropriate clock control signals, In the illustrated embodiment, SCANPH1 and SPH1EN would be high and SCANPH2 and SPH2EN would be would be low. Hence PH2 is held high, PH1 and SC2 are held low and SC1 clocks data into the shift registers 24 of scan path 22a (state 44). Since shift register 20 holds sixteen bits of data, the external test circuitry 10 allows SC1 to run for 16 clocks to shift the contents of shift register 20 into the scan path registers 24. The load and scan cycles are repeated until the test data propagates through to the desired shift registers 24. When the test data is loaded into the shift registers 24, the external test circuitry 10 sets the external control signals to "101", the capture state. In response to this state, the test control circuitry 34 sets the CAPTURE signal (internal to the test control circuitry 34) high (state 46), which has the effect of flipping the states of the PH1 and PH2 clocks after one clock cycle and switching the SEL to switch the active scan path from scan path 22a to 22b. Upon the high-to-low transition of PH2 (state 48), the associated shift registers 26 latch the data output from the respective logic circuits. By setting the external control to "001", the scan state is reentered (SHIFT high), this time with scan path 22b active. Hence, the SC2 clock runs, transferring data from scan path 22b to shift register 20 (state 50). After sixteen clocks, the test circuitry 10 reads the data in shift register 20 by setting the external control pins to "100", the write state. The scan and write states are repeated until the desired data has been transferred from scan path 22b.

Although the illustrated embodiment shows test data being loaded into the PH1 scan path 22a and the resultant output of the logic being unloaded from the PH2 scan path 22b, either scan path, or both, can be used in either capacity. This aspect of the invention is shown in greater detail in connection with FIG. 6. If it is desired to load scan path 22b first after a reset of the IC 14, then the capture state should be entered prior to entering the load and scan states.

Figure 5:
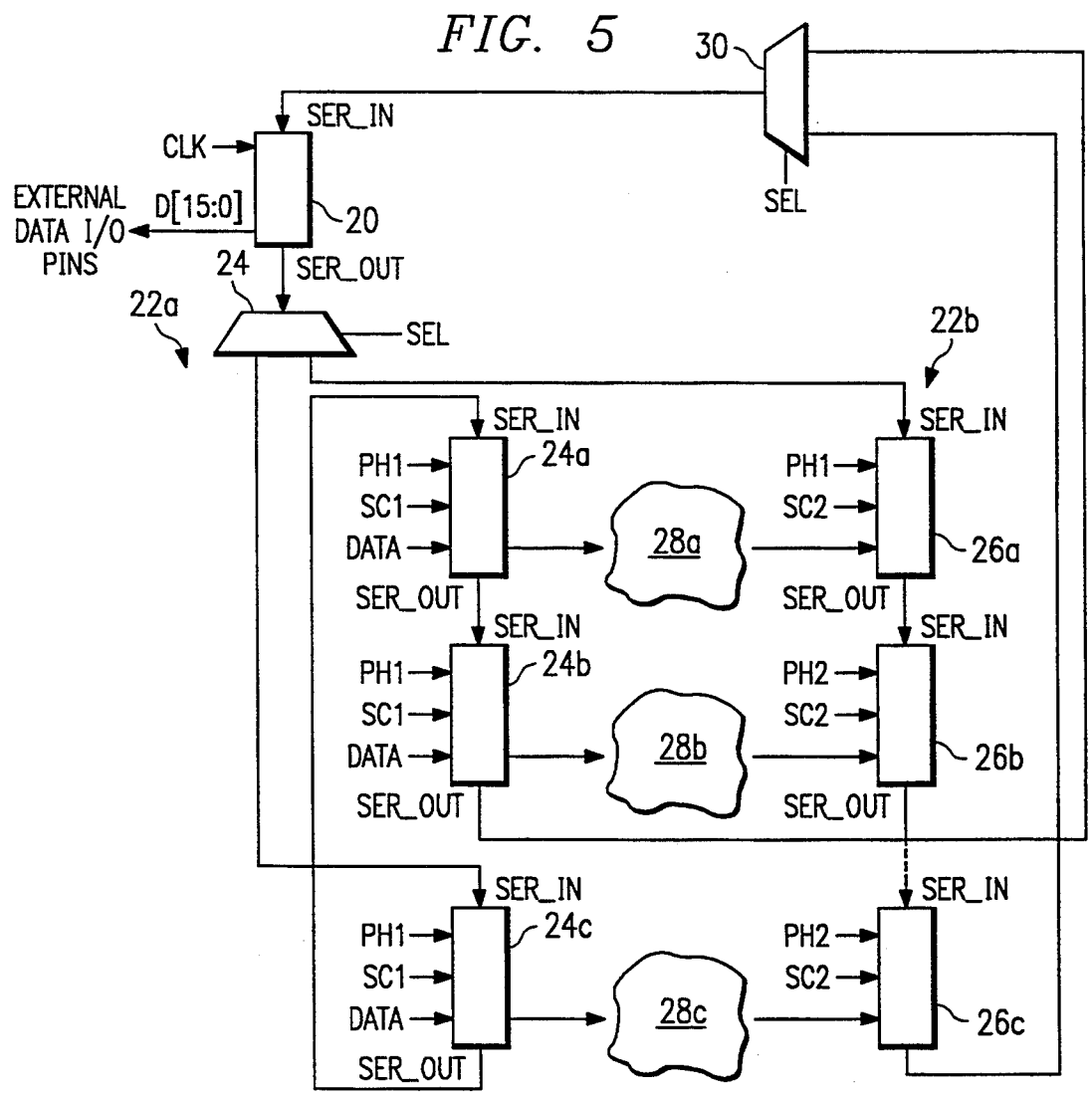
FIG. 5 illustrates an alternative embodiment of the architecture of FIG. 3 used to increase the speed of testing for certain logic blocks.
Figure 6:
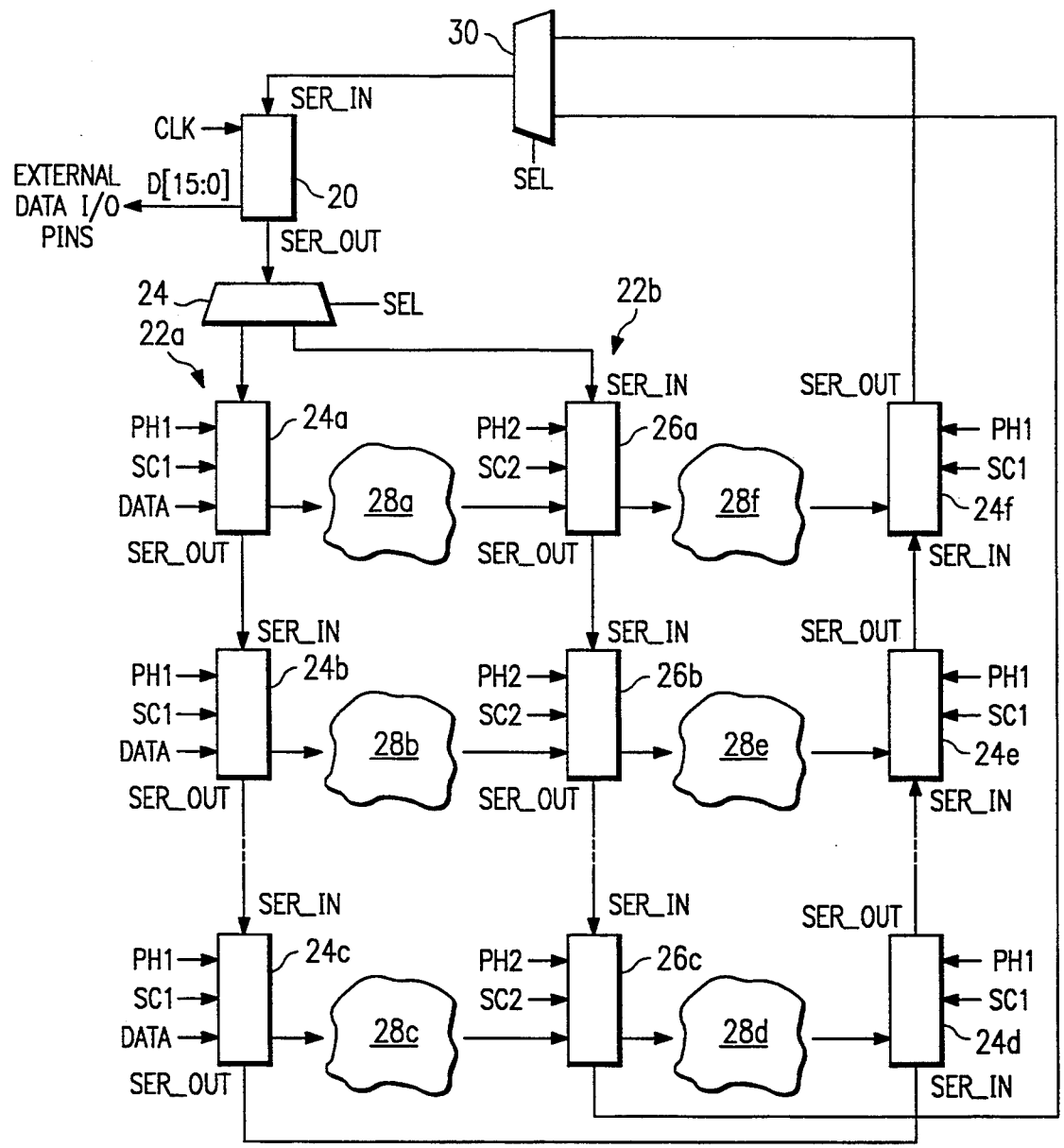
FIG. 6 illustrates an alternative embodiment of the scan path architecture where the scan paths are used to both receive test data to be used as a stimulus to the logic and receive outputs from the logic for subsequent evaluation.

2.3 Alternative Embodiments. FIGS. 5 and 6 illustrate alternate configurations of the scan paths 22a-b which provide additional benefits. In FIG. 5, scan path 22a is configured such that shift register 24c is the first shift register in scan path 22a. The data from shift register 24c is used to stimulate logic 28c, whose output is captured by shift register 26c of scan path 22b. Thus, shift register 24c can be loaded with the minimum number of SC1 clock cycles, since it is the first shift register in scan path 22a and data directed thereto does not pass through any intermediary registers 24. Further, shift register 26c can be unloaded to shift register 20 with the minimum number of clock cycles, since shift register 26c is the last shift register in scan path 22b, and thus data scanned out of register 26c is input directly to shift register 20.

The configuration of FIG. 5 is most beneficial when a large number of tests are performed on a portion of the logic circuits 28 of the IC 14 relative to other logic circuits 28 on the IC 14. This configuration allows the shift registers 24 and 26 to be loaded and unloaded in the minimum number of clock cycles, thus reducing test time.

FIG. 6 illustrates a second alternative embodiment, where the PH2 shift registers 26 are used to both receive data from the logic circuits 28a-c and to stimulate logic circuits 28d-f. The output of logic circuits 28d-f is latched by shift registers 24d-f, respectively.

In this embodiment, data is initially scanned into the shift registers 24 of scan path 22a. This data is used to stimulate logic circuits 28a-c. The resultant output of logic circuits 28a-c is latched into shift register 26a-c after entering the capture state. After the capture state is entered, scan path 22b becomes the active scan path. New test data can be input to scan path 22b as the resultant data is being unloaded. Thereafter, another capture state allows the data in shift registers 26a-c to stimulate logic circuits 28d-f, with the resultant data from the logic circuits being latched into shift registers 24d-f. The resultant data can then be scanned out of scan path 22a as new data is loaded into registers 24a-c for additional tests on logic circuits 28a-c.

While the exemplary circuit of FIG. 6 shows two stages of testing, any number of stages may be used. Further, while FIG. 6 shows data from logic circuits 28d-f being latched by shift registers 24d-f, it would be possible to pass the output of logic circuits 28d-f back to shift registers 24a-c, if desired.

3. Conclusion

The present invention, as described in connection with the preferred embodiments shown above, provides significant advantages over single scan path test circuits in both speed and flexibility.

Although the Detailed Description of the invention has been directed to certain exemplary embodiments, various modifications of these embodiments, as well as alternative embodiments, will be suggested to those skilled in the art. For example, the invention has general applicability to any type of circuit where scan testing is desirable.

The invention encompasses any modifications or alternative embodiments that fall within the scope of the claims.

What is claimed is:

1. A scan test architecture in an asynchronous-sequential latch based integrated circuit comprising:
   (a) I/O shift register means for receiving and transmitting a plurality of test and result data in parallel and in serial;
   (b) first multiplexer means, coupled to the I/O shift register means, for serially routing the plurality of test data;
   (c) first and second independent serial scan path means, coupled to the first multiplexer means and respectively responsive to mutually exclusive first and second scan clock signals, for selectively receiving the plurality of serial test data or a plurality of parallel result data and for selectively outputting the plurality of test data in parallel or the plurality of result data in serial;
   (d) combinatorial logic means, coupled between the first and second scan path means, for receiving the plurality of test data and for providing the plurality of result data; and,
   (e) a second multiplexer means, coupled between the first and second scan path means and the I/O shift register means, for selectively routing the plurality of test and result data from one of the first and second scan path means to the I/O shift register means.

2. A scan test architecture recited in claim 1 wherein the first and second scan path means are defined as having a top and a bottom, the top of the first scan path means being coupled through the combinatorial logic means so that a predetermined number of the plurality of test data are coupled to the bottom of the second scan path means.

3. A scan test architecture as recited in claim 1 wherein the combinatorial logic means is coupled between the first and second scan path means so that both the first and the second scan path means receive, in turn, portions of the plurality of test and result data.

4. A scan test architecture for an asynchronous-sequential latch based integrated circuit, comprising:
   (a) a data I/O shift register having a serial input, a serial output, and a plurality of parallel inputs and outputs for receiving and transmitting test and result data;
   (b) a first multiplexer having an input, and first and second outputs, the input being coupled to the serial output of the data I/O shift register;
   (c) a first and a second independent scan path, each path defined by a plurality of serially coupled shift registers,
      each shift register having a serial input and a serial output, a plurality of parallel inputs and outputs, and a clock input, the clock input of respective first and second scan paths being coupled to mutually exclusive clock signals, and respective serial inputs being coupled to the first and second outputs on the first multiplexer;

(d) combinatorial logic circuitry coupled between the plurality of outputs on the first scan path and the plurality of inputs on the second scan path; and, (e) a second multiplexer having first and second inputs and an output, the first input being coupled to the serial output of the first scan path, the second input being coupled to the serial output of the second scan path, and the output being coupled to the serial input on the data I/O shift register.

5. A scan test architecture as recited in claim 4 wherein the first scan path is arranged such that the parallel outputs of a first shift register in the plurality of concatenated shift registers are coupled through the combinatorial logic circuitry to the parallel inputs of a last shift register in the plurality of concatenated shift registers in the second scan path.

6. A scan test architecture as recited in claim 4 wherein the parallel inputs of at least one of the plurality of concatenated shift registers in the first scan path are coupled to the parallel outputs of at least one of the plurality of concatenated shift registers in the second scan path.

7. In a latch based asynchronous-sequential integrated circuit having first and second independent scan paths, a method of scan testing combinatorial logic with first and second mutually exclusive scan clock signals comprising the steps of:

(a) receiving test data in parallel and result data in serial into a shift register;

(b) selectively routing the test data in serial from the shift register to one of a first and a second serial scan path;

(c) in response to one of the first and second mutually exclusive scan clock signals, selectively receiving the test data into one of the first and second serial scan paths and outputting the test data in parallel to the combinatorial logic;

(d) in response to receiving the test data into the combinatorial logic, generating the result data;

(e) serially routing the result data into the shift register recited in step (a); and, (f) transmitting the result data in parallel from the shift register recited in step (a) to a test system external to the integrated circuit.

8. A method of scan testing as recited in claim 7 wherein step (c) is further defined by the step of outputting a predetermined number of the test data at the top of the first scan path through the combinatorial logic to the bottom of the second scan path.

9. A method of scan testing as recited in claim 7 wherein step (c) is further defined by the step of receiving test and result data into at least one of the first and second scan paths.

* * * * *